(12) United States Patent
Yanduru et al.

(10) Patent No.: US 8,576,010 B2
(45) Date of Patent: Nov. 5, 2013

(54) APPARATUS AND METHOD FOR A SWITCHED CAPACITOR ARCHITECTURE FOR MULTI-BAND DOHERTY POWER AMPLIFIERS

(75) Inventors: Naveen Yanduru, Richardson, TX (US); Robert Monroe, Melissa, TX (US); Mike Brobston, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/247,103

(22) Filed: Sep. 28, 2011

(65) Prior Publication Data

US 2012/0092074 A1 Apr. 19, 2012

Related U.S. Application Data

(60) Provisional application No. 61/394,622, filed on Oct. 19, 2010.

(51) Int. Cl.
*H03F 3/68* (2006.01)

(52) U.S. Cl.
USPC .................. 330/295; 330/305; 330/124 R

(58) Field of Classification Search
USPC .......... 330/305, 302, 295, 124 R, 53, 84, 286
See application file for complete search history.

(56) References Cited

U.S. PATENT DOCUMENTS 7,656,228 B2* 2/2010 Fukuda et al. ................ 330/126
7,936,213 B2* 5/2011 Shin et al. ................ 330/124 R

* cited by examiner

*Primary Examiner* — Hieu Nguyen
(74) *Attorney, Agent, or Firm* — Jefferson IP Law, LLP

(57) ABSTRACT

An apparatus and method for a switched capacitor architecture for multi-band Doherty power amplifiers are provided. The apparatus is for amplifying Radio Frequency (RF) signals, and the apparatus includes a multi-band Power Amplifier (PA) including a plurality of input matching circuits including switchable capacitors, and a plurality of output matching circuits including the switchable capacitors, wherein the multi-band PA is tunable to more than one RF frequency band.

19 Claims, 6 Drawing Sheets

| E-ULTRA OPERATING BAND | UPLINK (UL) OPERATING BAND BS RECEIVE UE TRANSMIT FUL_LOW - FUL_HIGH | DOWNLINK (DL) OPERATING BAND BS TRANSMIT UE RECEIVE FDL_LOW - FDL_HIGH | DUPLEX MODE |
|---|---|---|---|
| 1 | 1920 MHz - 1980 MHz | 2110 MHz - 2170 MHz | FDD |
| 2 | 1850 MHz - 1910 MHz | 1930 MHz - 1990 MHz | FDD |
| 3 | 1710 MHz - 1785 MHz | 1805 MHz - 1880 MHz | FDD |
| 4 | 1710 MHz - 1755 MHz | 2110 MHz - 2155 MHz | FDD |
| 5 | 824 MHz - 849 MHz | 869 MHz - 894 MHz | FDD |
| 6 | 830 MHz - 840 MHz | 875 MHz - 885 MHz | FDD |
| 7 | 2500 MHz - 2570 MHz | 2620 MHz - 2690 MHz | FDD |
| 8 | 880 MHz - 915 MHz | 925 MHz - 960 MHz | FDD |
| 9 | 1749.9 MHz - 1784.9 MHz | 1844.9 MHz - 1879.9 MHz | FDD |
| 10 | 1710 MHz - 1770 MHz | 2110 MHz - 2170 MHz | FDD |
| 11 | 1427.9 MHz - 1447.9 MHz | 1475.9 MHz - 1495.9 MHz | FDD |
| 12 | 699 MHz - 716 MHz | 729 MHz - 746 MHz | FDD |
| 13 | 777 MHz - 787 MHz | 746 MHz - 756 MHz | FDD |
| 14 | 788 MHz - 798 MHz | 758 MHz - 768 MHz | FDD |
| 15 | RESERVED | RESERVED | FDD |
| 16 | RESERVED | RESERVED | FDD |
| 17 | 704 MHz - 716 MHz | 734 MHz - 746 MHz | FDD |
| 18 | 815 MHz - 830 MHz | 860 MHz - 875 MHz | FDD |
| 19 | 830 MHz - 845 MHz | 875 MHz - 890 MHz | FDD |
| 20 | 832 MHz - 862 MHz | 791 MHz - 821 MHz | |
| 21 | 1447.9 MHz - 1462.9 MHz | 1495.9 MHz - 1510.9 MHz | FDD |
| ... | | | |
| 33 | 1900 MHz - 1920 MHz | 1900 MHz - 1920 MHz | TDD |
| 34 | 2010 MHz - 2025 MHz | 2010 MHz - 2025 MHz | TDD |
| 35 | 1850 MHz - 1910 MHz | 1850 MHz - 1910 MHz | TDD |
| 36 | 1930 MHz - 1990 MHz | 1930 MHz - 1990 MHz | TDD |
| 37 | 1910 MHz - 1930 MHz | 1910 MHz - 1930 MHz | TDD |
| 38 | 2570 MHz - 2620 MHz | 2570 MHz - 2620 MHz | TDD |
| 39 | 1880 MHz - 1920 MHz | 1880 MHz - 1920 MHz | TDD |
| 40 | 2300 MHz - 2400 MHz | 2300 MHz - 2400 MHz | TDD |
| 41 | 2496 MHz - 2690 MHz | 2496 MHz - 2690 MHz | TDD |
| 42 | 3400 MHz - 3600 MHz | 3400 MHz - 3600 MHz | TDD |
| 43 | 3600 MHz - 3800 MHz | 3600 MHz - 3800 MHz | TDD |
| NOTE 1: BAND 6 IS NOT APPLICABLE. | | | |

APPARATUS AND METHOD FOR A SWITCHED CAPACITOR ARCHITECTURE FOR MULTI-BAND DOHERTY POWER AMPLIFIERS

CROSS-REFERENCE TO RELATED APPLICATIONS

This application claims the benefit under 35 U.S.C. §119 (e) of a U.S. Provisional application filed on Oct. 19, 2010 in the U.S. Patent and Trademark Office and assigned Ser. No. 61/394,622, the entire disclosure of which is hereby incorporated by reference.

BACKGROUND OF THE INVENTION

1. Field of the Invention

The present invention relates to an apparatus and method for a switched capacitor architecture for multi-band Doherty power amplifiers. More particularly, the present invention relates to an apparatus and method for a frequency tunable Doherty power amplifier having a switched capacitor architecture.

2. Description of the Related Art

The use of and consumer demand for mobile communications has continued to rapidly increase over the recent years, with the number of persons using mobile communications increasing while the number and types of data-rich mobile applications and services also rapidly increasing. Long Term Evolution (LTE) systems developed by the $3^{rd}$ Generation Partnership Project (3GPP) are being implemented in order to satisfy the increased consumer demand. The LTE systems developed by the 3GPP provide a wireless communication network and mobile communication system having larger capacity, higher throughput, lower latency and better reliability. LTE systems utilize multiple Radio Frequency (RF) bands across a frequency spectrum that is defined for cellular and wireless applications. In particular, the LTE standard developed by the 3GPP defines over 27 different operational frequency bands.

FIG. 1 is a table illustrating LTE RF bands designated as Receive (RX) and Transmit (TX) RF bands according to the related art.

Referring to FIG. 1, typically, each of the RX and TX RF bands is approximately less than 80 MHz wide, however, the RX and TX RF bands are scattered across a frequency range of 698 MHz to 2680 MHz for base station RX bands that are used for uplink connections, and 728-2690 MHz for base station TX bands that are used for downlink connections. For example, within a frequency span of 365 MHz, there are four major RF bands defined in the LTE standard, including Digital Communication Service-1800 (DCS-1800), or band-3, Personal Communication Service (PCS1900), or band-2, Advanced Wireless Services (AWS), or band-4 and Universal Mobile Telecommunications Service 2100 (UMTS2100), or band-1.

For a mobile communication system having multiple RF bands, a transmitter of the related art includes dedicated Power Amplifiers (PAs) for each of the RF bands. Using dedicated PAs for each of the RF bands allows for narrow band matching networks that result in increased PA performance when compared to broadband PAs using wideband matching networks that are for more than one RF band of the multiple RF bands. Thus a number of PAs required in multi-band applications or mobile communication networks using an entirety of the LTE bands increases an amount of hardware included in the transmitter of the related art resulting in increasing costs and complexity with respect to network infrastructure and terminal applications.

A broadband PA can be used to operate across multiple RF bands but is prone to reduced gain, reduced power, reduced efficiency and reduced linearity as compared to a PA implementing narrowband matching. Accordingly, the broadband PA is not a suitable solution. A frequency tunable PA is a proposed solution to the problems of the broadband PA, however conventional PA technology does not include a suitable frequency tunable PA. Additionally, another important consideration in PA design is the power added efficiency of the PA. The leading PA efficiency enhancement techniques of the related art include supply modulation and load modulation techniques.

Supply modulation techniques, which include Envelope Tracking (ET), and Envelope Elimination and Restoration (EER), achieve high PA drain efficiency, for example 50-60%. Although EER can theoretically achieve higher efficiency than ET, EER suffers from a number of drawbacks such as low gain, stringent timing alignment, a high supply modulation bandwidth requirement, a high phase modulation path bandwidth, direct feed-through contamination at low output, and a low Power Supply Rejection Ratio (PSRR). For LTE and WiMax systems, envelope tracking PAs may have a final stage efficiency as high as 57% at 2.1 GHz using a High Voltage-Heterojunction Bipolar Transistor (HV-HBT). However, in order to achieve this, HV-HBTs have narrowband harmonic terminations within a packaging of the HV-HBT, and is not used for bandwidths greater than 100 MHz. Additionally, ET modulator signal bandwidth is limited to 20 MHz currently, which may increase up to 40 MHz, hence ET is not suitable for even moderate bandwidths of 60 MHz.

In contrast to supply modulation techniques, Doherty power amplifiers use a load modulation technique in order to achieve a high PA drain efficiency. Doherty PAs of the related art can achieve up to 57% average drain efficiency for LTE and WiMax signals. Doherty PAs are typically lower cost than the ET based PAs discussed above since they do not require an expensive envelope modulator, and therefore are more widely used in industry. However, Doherty PAs are considered to be narrow band due to the Doherty PAs' use of quarter-wave transformers resulting in narrow band operation of 60-100 MHz wide. Accordingly, neither envelope tracking PAs or Doherty PAs are suitable for wide bandwidth or multi-band applications FIG. 2 illustrates a Doherty PA according to the related art.

Referring to FIG. 2, a Doherty PA 200 includes a signal input line 201 connected to a hybrid coupler 202. The hybrid coupler 202 splits an input signal received from the signal input line 201 so that the split input signal travels to both a first input matching network 203 and a second input matching network 204. The first and second input matching networks 203 and 204 convert a 50 ohm impedance of the signal input line 201 into a low impedance of a first amplifier 207, which is also referred to as a carrier transistor 207, and a second amplifier 208, which is also referred to as a peaking transistor 208, which are both connected to respective output matching networks 209 and 210 in order convert a low transistor output impedance into higher impedances for the Doherty output combiner 212. Offset lines 211 and 213 rotate an impedance of the peaking transistor 208 such that it appears close to be an open circuit at low drive levels so that the carrier transistor 207 does not waste power by driving signals into the output of the peaking transistor 208 which otherwise would degrade overall PA efficiency. The Doherty combiner is a 50 ohm λ/4 impedance inverter used to load modulate the transistors 207 and 208, and is used in conjunction with a 35 ohm load matching λ/4 transmission line in order to provide an approximately 50 ohm impedance to the output connector 215. Also shown in FIG. 2 are λ/4 gate and drain bias feed lines 206 for providing a high RF impedance to the carrier and peaking transistors 207 and 208 gate and drain nodes so that RF signals do not propagate into the DC power supply and spread RF into other circuits connected to the DC supply. Bias circuits 205 are used to convert a 5V DC supply voltage into a bias voltage that is a gate voltage to set the quiescent, or idle, current of the carrier and peaking transistors 207 and 208 in order to set a class of transistor operation. For example, the class of the transistor operation may be set to Class-AB for a carrier transistor and Class-C for a peaking transistor. The bias voltage may be positive or negative corresponding to a transistor technology.

In order to allow the Doherty PA 200 to be utilized for more than one band, a large number of the elements included in the conventional Doherty PA 200 shown in FIG. 2 are to be tuned. Specifically, the Doherty output combiner 212, the 35 ohm load matching λ/4 transmission line 214, the first and second input matching networks 203 and 204, and the first and second output matching networks 209 and 210, and the offset lines 211 and 213 are to be frequency tuned corresponding to each of the frequency bands in which the Doherty PA 200 operates. Additionally, the λ/4 bias feed lines 206 can also be tuned to each frequency band, although this is not required since not tuning these lines may only degrade overall PA efficiency by 1-2%.

Thus, the Doherty PA is frequency sensitive due to the various components of the Doherty PAs that are frequency dependent. Therefore, frequency tuning of the Doherty PA components is not easily done due to the lack of available high power tunable components. Accordingly, there is a need for a frequency tunable Doherty Power Amplifier in order to achieve high PA efficiency and linearity across multiple frequency bands, and hence, an apparatus and method for a switched capacitor architecture of a multi-band Doherty power amplification is needed.

SUMMARY OF THE INVENTION

Aspects of the present invention are to address at least the above-mentioned problems and/or disadvantages and to provide at least the advantages described below. Accordingly, an aspect of the present invention is to provide an apparatus and method for a switched capacitor architecture for multi-band Doherty power amplifiers.

In accordance with an aspect of the present invention, an apparatus for amplifying Radio Frequency (RF) signals is provided. The apparatus includes a multi-band Power Amplifier (PA) including a plurality of input matching circuits including switchable capacitors, and a plurality of output matching circuits including the switchable capacitors, wherein the multi-band PA is tunable to more than one RF frequency band.

In accordance with another aspect of the present invention, a method for tuning a multi-band Power Amplifier (PA) is provided. The method includes switching switchable capacitors of input matching circuits of the multi-band PA in order to select a Radio Frequency (RF) band of a plurality of RF bands, switching switchable capacitors of output matching circuits of the multi-band PA in order to select a Radio Frequency (RF) band of a plurality of RF bands, and activating switchable capacitors of amplifiers in order to amplify a RF signal corresponding to the selected RF band, wherein the switchable capacitors of the amplifiers can be tuned to more than one of the plurality of the RF bands.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 1 is a table illustrating Long Term Evolution (LTE) Radio Frequency (RF) bands designated as Receive (RX) and Transmit (TX) RF bands according to the related art;

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention include an apparatus and method for a switched capacitor architecture for multi-band Doherty power amplifiers.

Figure 2:
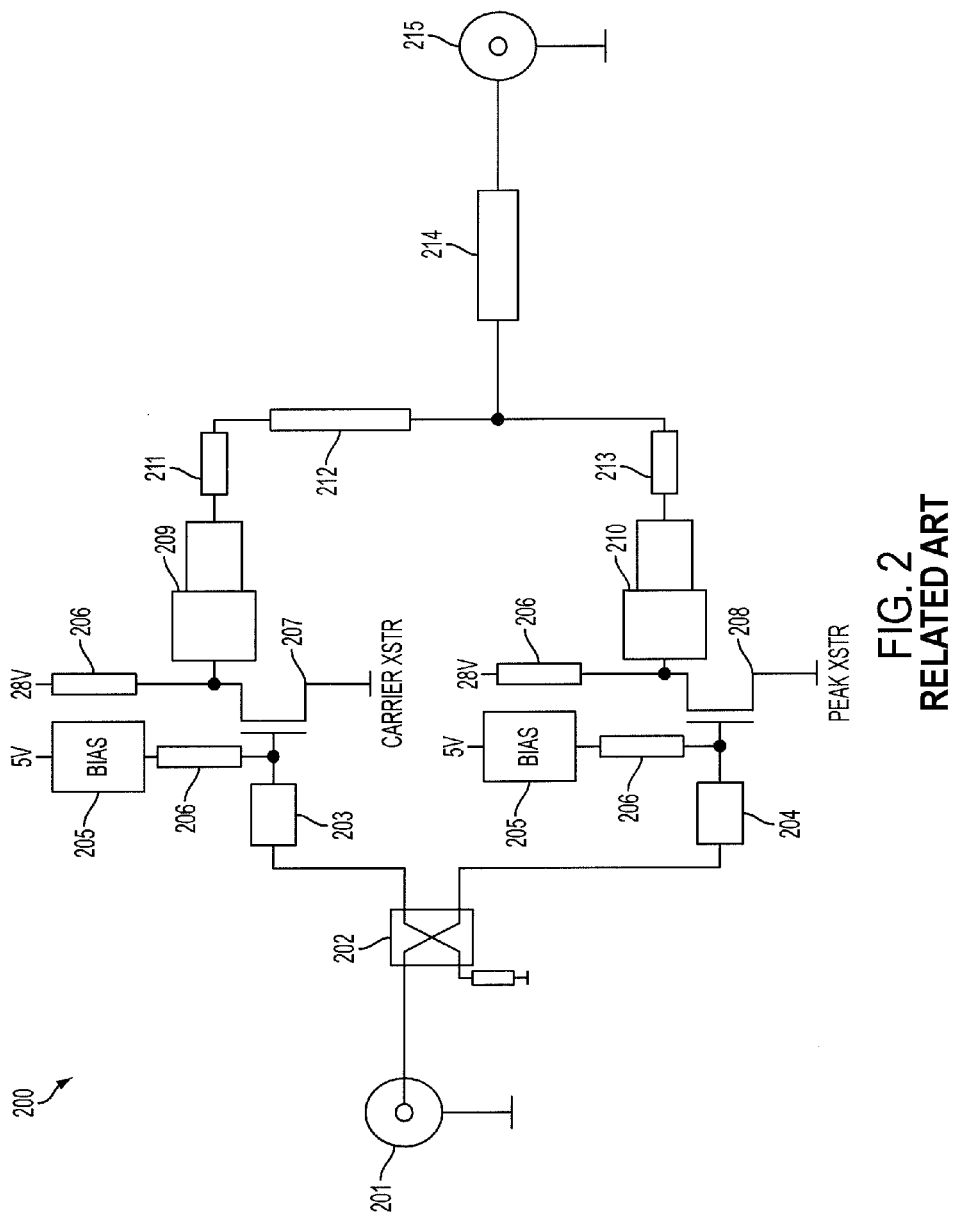
FIG. 2 illustrates a conventional Doherty Power Amplifier (PA) according to the related art.

Exemplary embodiments of the present invention provide a frequency tunable Doherty Power Amplifier (PA) that reduces a need for a dedicated narrow-band PA for each RF band on which a transmitter transmits Radio Frequency (RF) signals. For example, in the Long Term Evolution (LTE) system having 27 RF bands, rather than having a dedicated narrow-band PA for each of the 27 RF bands, a frequency tunable Doherty PA with switchable capacitors used to implement frequency tuning in the Doherty PA is provided. But as shown in FIG. 2, tuning a Doherty PA not only involves tuning the matching networks, but also tuning the multiple $\lambda/4$ lines and offset lines used in the Doherty PA design.

Exemplary embodiments of the present invention provide an apparatus and a method providing a frequency tuning of the Doherty PA using switchable or tunable capacitors. Switchable and tunable capacitors for low power levels, i.e., power levels less than 2 watts are commercially available, and switchable capacitors for high RF power levels, i.e., greater than 50 watts, are currently under development.

In order to achieve the frequency tunable Doherty PA, at least one of a tunable element that allows a continuous range of tunable capacitance, or a switchable device that operates in either a capacitive or open state is used in the frequency tunable Doherty PA. Tunable elements that may be used in the tunable Doherty PA include varactor diodes, Barium Strontium Titanate (BST) devices, Micro-Electro-Mechanical Systems (MEMS) devices, or various types of electrical switches used in combination with fixed capacitors. The electrical switches could be any one of Gallium Arsenide (GaAs) Field Effect Transistor (FET) devices, Metal Oxide Semiconductor Field Effect Transistor (MOSFET) devices, Silicon-on-Insulator (SoI) devices, or other types of semiconductor or electro-mechanical switches. However, aspects of the present invention are not limited thereto, and other suitable tunable elements or combinations of elements may be used as the tunable elements in the tunable Doherty PA.

Although varactor diodes provide tunable capacitance, at the present time, they are not commonly implemented into commercial power amplifiers for reasons of cost, a limited capacitance range, limited power handling, and poor linearity, among other problems. Specific examples of tunable capacitors that have been developed include a tunable capacitor using voltage dependent dielectric materials or ferroelectric materials. These tunable capacitors are fabricated using a BST substrate, wherein a change in a RF capacitance, or in other words, capacitance tuning, is realized by changes in a substrate dielectric constant due to an application of Direct Current (DC) voltages to the BST substrate. However, there are several limitations to the use of BST tunable capacitors for tunable matching networks, which are used by the tunable Doherty PA, including the maximum power capability of the BST tunable capacitors being only a few watts. Alternatively, it is possible that BST technology could be used as the tunable element in a high power tunable Doherty PA by combining them into a series and parallel array. However, series or parallel arrays of BST tunable capacitors results in increased cost and complexity for the tunable Doherty PA.

Tunable capacitance may also be achieved through a combination of mechanical or semiconductor switches with fixed capacitors. RF switches fabricated as GaAs FET devices, Gallium Nitride (GaN), or SoI switches may be combined with fixed capacitors in the form of singulated capacitors or as an integrated passive device such as a Metal-Insulator-Metal (MIM) capacitor. For example, Silicon on Sapphire (SoS) technology has been proposed as an enabling technology for tunable matching networks implementing a hybrid switched capacitor approach using MOSFET switches on SoS substrates. Low loss RF Complimentary Metal Oxide Semiconductor (CMOS) switches, RF capacitors, and control logic are incorporated into a monolithically integrated circuit in order to provide switchable devices and tunable capacitors.

Figure 5:
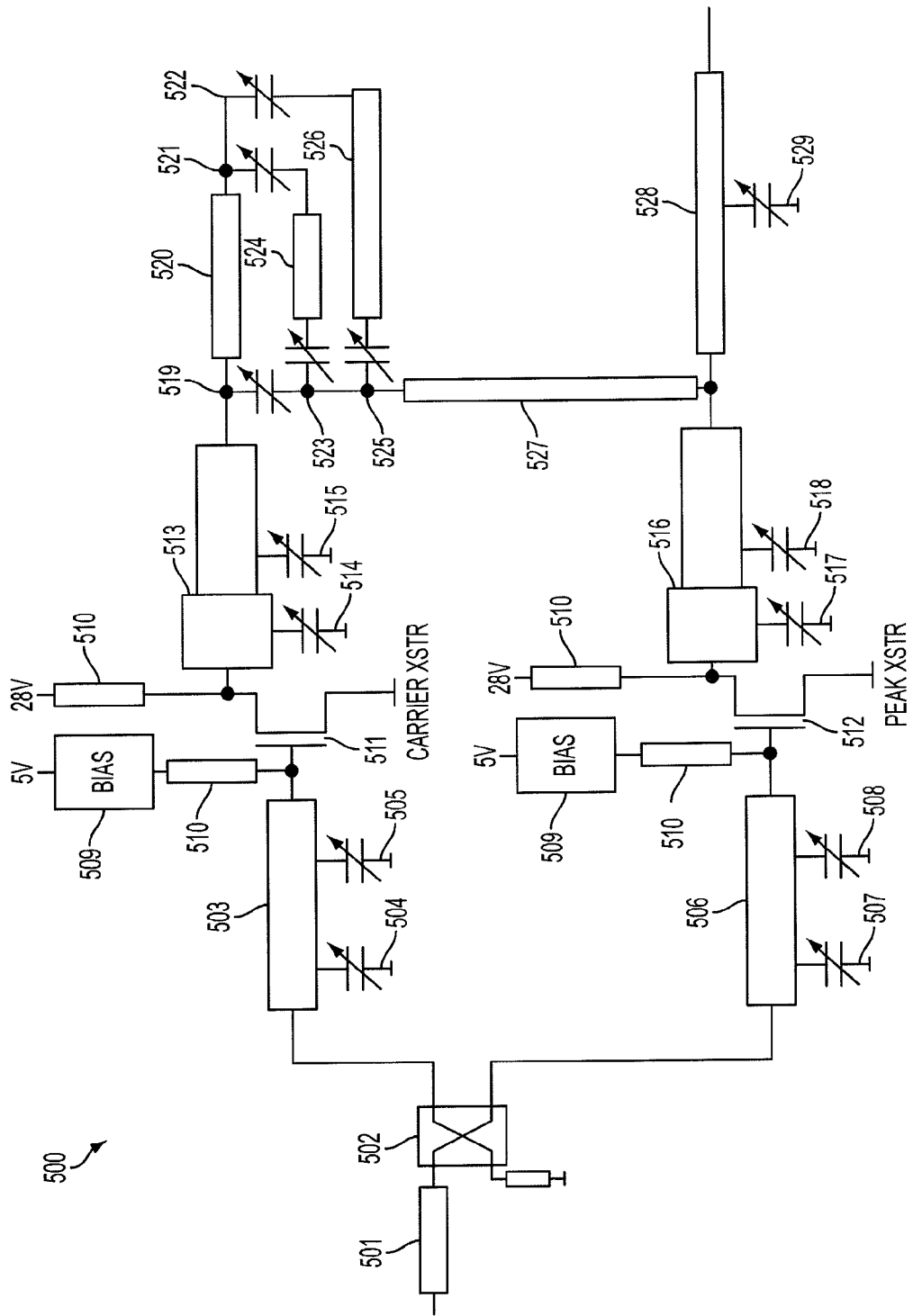
FIG. 5 illustrates the tunable Doherty PA of FIG. 4 having multi-switchable capacitors and ON/OFF switchable capacitors selecting one frequency band according to an exemplary embodiment of the present invention.
Figure 6:
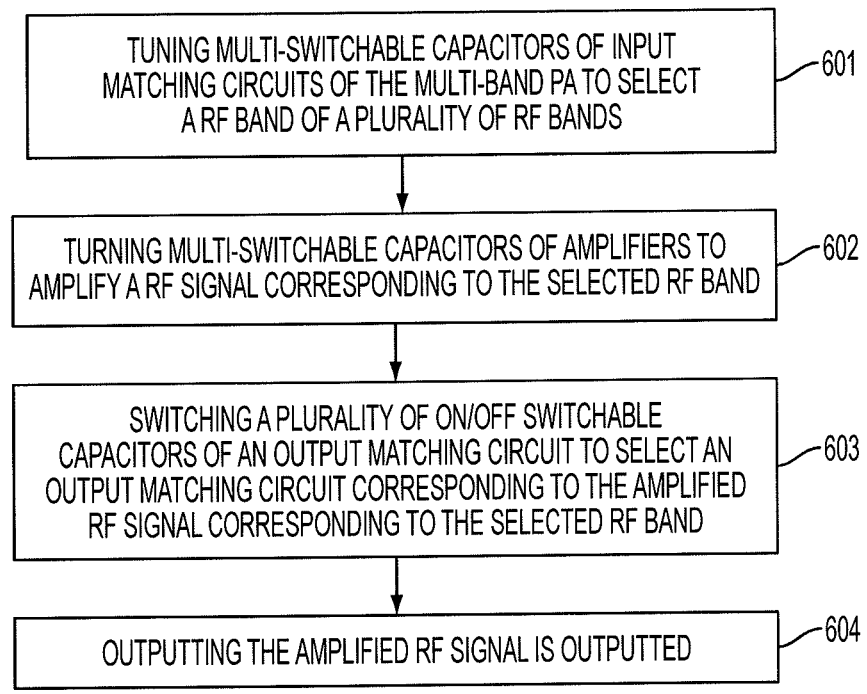
FIG. 6 is a flowchart showing a method of tuning the tunable Doherty PA of FIG. 4 according to an exemplary embodiment of the present invention.

RF switches may be used in the tunable Doherty PA to connect and disconnect the different output combiners (see FIGS. 5 and 6). Common RF switches are made of PIN diodes, GaAsFET, GaN, SOI, CMOS, MEMS switches, and other suitable materials or elements. Although most presently available commercial RF switches are only suitable for low RF power levels of approximately less than 10 W, next generation RF switches made form Gallium Nitride (GaN) may be operable at higher RF power levels of greater than 10 W. In addition to tunable capacitors and RF switches as described above, another frequently described form of a switch capacitor is a MEMS device implemented as either a separate RF MEMS switch with a fixed capacitor or an integrated switched capacitor. For the integrated switched capacitor, the capacitor is switched between a capacitive state and an open state by opening and closing metalized plates separated by a dielectric material layer. However, presently, these devices are manufactured through a wafer fabrication process and are often limited to operating at less than 2 W. Any of the above describes tunable capacitors, RF switches and other tunable electronic devices, when operating at a high RF power level of approximately 50 W may be used in tunable Doherty PA.

Figure 3:
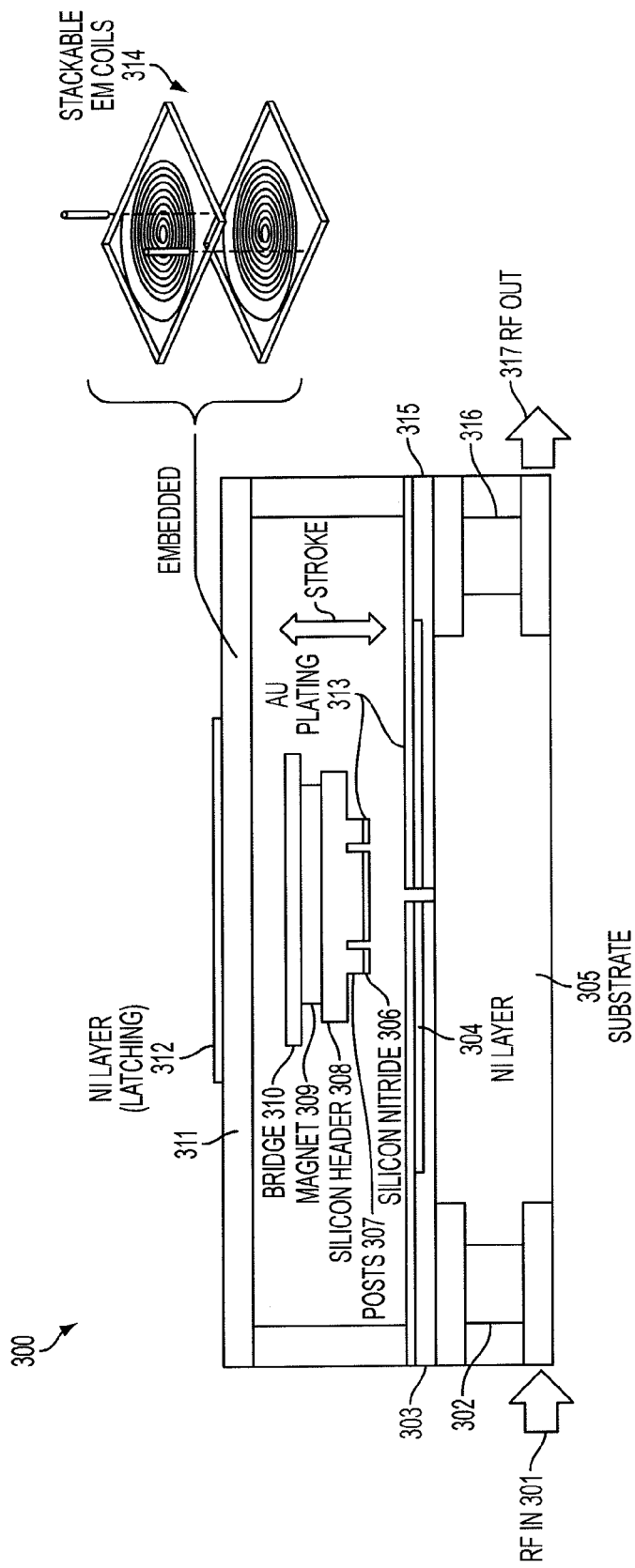
FIG. 3 illustrates an exemplary switchable RF capacitor for use in a tunable Doherty PA according to an exemplary embodiment of the present invention.

FIG. 3 illustrates an exemplary switchable RF capacitor for use in a tunable Doherty PA according to an exemplary embodiment of the present invention.

Referring to FIG. 3, a Laminate MEMs (LMEMs) device that may operate at a high RF power level of more than 50 W provides a tunable capacitance when coupled with a suitable actuation mechanism. Particularly, FIG. 3 illustrates a switchable RF capacitor 300. The switchable RF capacitor 300 includes an RF input port 301, a plurality of vias 302, an input transmission line 303, an embedded nickel layer 304, a Printed Circuit Board (PCB) substrate 305, a silicon header 308 with protruding sections 307, which are also referred to as posts 307, plated with gold 313 and an insulating silicon nitride layer 306, a magnet 309 disposed on a top face of the silicon header 308, and a bridge 310 disposed on the magnet 309. The magnet 309 may be directly connected to the bridge 310 and the silicon header 308 so as to be disposed between the bridge 310 and the silicon header 308. Upper PCB layer 311 includes an embedded pair of electromagnetic (EM) coils 314 and has a nickel layer 312 disposed on top of the upper PCB layer 311. An output transmission line 315 is connected to a plurality of output vias 316 and connected to output port 317.

Figure 4:
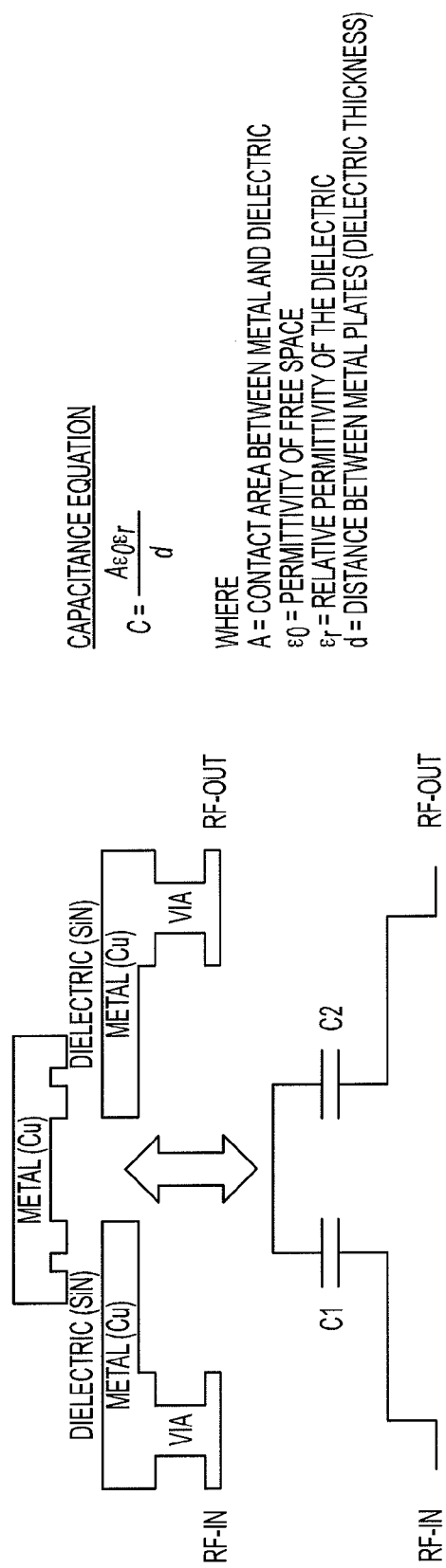
FIG. 4 illustrates an equivalent electrical model for an exemplary switchable RF capacitor according to an exemplary embodiment of the present invention.

The LMEMs switchable RF capacitor 300 is mounted to a power amplifier PCB. At a bottom corner of the device, RF current enters port 301 and proceeds through vias 302 into the input transmission line 303. When there is no current passing through Electro-Magnetic (EM) coils 314, the magnet 309 is drawn toward the nickel layer 312 and latches in an up position, as shown in FIG. 3. There is a separating air gap between the input transmission line 303 and the output transmission line 315 in order to create an equivalent open circuit which prevents RF current from flowing to the output port 317. When a current is passed through the EM coils 314, a magnetic force pushes the magnet 309 into a down position where it is attracted to the embedded nickel layer 304, and the silicon header 308 and the posts 307 contact the input and output transmission lines 303 and 315 respectively. In this state, the silicon nitride layer 306 is disposed between two copper plates, which are the input and output transmission lines 303 and 315 and which are made of copper, and gold plated Silicon header 308 so as to form a parallel plate capacitor as defined by a capacitance equation shown in FIG. 4. As shown in FIG. 4, RF current flows through the capacitors and out of the output port 317.

The laminate based switchable RF capacitor can be scaled for use in high voltage and current environments, and accordingly, high power applications. Laminate based devices are comparable to MEMS devices and are typically fabricated using a PCB manufacturing processes using much larger dimensions, spacing, and metal thickness than is possible with a semiconductor wafer fabrication processes. Therefore the laminate based devices can be designed for operation at much higher power levels and voltages than is achievable with standard MEMS devices. Accordingly, the laminate based switchable RF capacitor will be assumed with respect to the below discussion of exemplary embodiments of the tunable Doherty PA. However, as noted above, aspects of the present invention are not limited to the laminate based switchable RF capacitor, and other suitable tunable and/or switchable elements, such as those discussed above may be used.

FIG. 5 is a tunable Doherty PA according to an exemplary embodiment of the present invention.

Referring to FIG. 5, the tunable Doherty PA 500 is a triband Doherty PA able to provide amplification for up to three different LTE RF bands. However, the present invention is not limited thereto, and a tunable Doherty PA may be for more than three different LTE RF bands. The tunable Doherty PA 500 includes an input transmission line 501 for inputting an RF signal corresponding to any one of the three different LTE RF bands. The hybrid coupler 502 equally divides the input signal into a first RF signal and a second RF signal, wherein the first RF signal and the second RF signal each have half of the power of the input RF signal and are different in phase by 90 degrees.

The hybrid coupler 502 is connected to a first input matching circuit 503 receiving the first RF signal and a second input matching circuit 506 receiving the second RF signal. The first input matching circuit 503 is connected to two shunt switchable capacitors 504 and 505. The second input matching circuit 506 is also connected to two switchable capacitors 507 and 508 in a shunt configuration. Switchable capacitors 504, 505, 507, and 508 may switch a capacitance according to the first RF signal that is one of the three different LTE RF bands of the input RF signal. However, aspects of the present invention are not limited thereto, and the switchable capacitors may switch their capacitance according to more or less than three LTE RF bands by having any number of suitable switchable capacitances. Furthermore, although each of the first input matching circuit 503 and the second input matching circuit 506 are disclosed as having two switchable capacitors each, aspects of the present invention are not limited thereto and a number of switchable capacitors may be reduced by having the switchable capacitors being re-used for as many different LTE RF bands as possible.

The first input matching circuit 503 is connected to a first transistor 511, which is also referred to as a carrier transistor 511, and has the switchable capacitors 504 and 505 attached to it. The second input matching circuit 506 is connected to a second transistor 512, which is also referred to as the peaking transistor 512, and has switchable capacitors 507 and 508 attached to it. The switchable capacitors are switched to be in a capacitor state or open state depending on a frequency band chosen in order to convert a respective transistor's low gate impedance into an impedance of the input combiner 502, which may be an impedance value of 50 ohms. However, the present invention is not limited thereto, and the input combiner 502 may have other impedance values. Each transistor input, which is a gate node, obtains a bias voltage through a gate feed transmission line 510 and a bias circuit 509. The bias voltage sets the transistor's quiescent, or idle drain current, which flows through the gate feed transmission line 510, to a predetermined value in order to achieve an optimized combination of power, gain, linearity and efficiency. Typically the carrier transistor 511 is a biased Class-AB transistor, and the peaking transistor 512 is a biased Class-C transistor in order to accomplish load modulation required in Doherty PAs.

A first output matching circuit 513 is connected to switchable capacitors 514 and 515, and a second output matching circuit 516 is connected to switchable capacitors 517 and 518. The switchable capacitors 514, 515, 517 and 518 are switched to be in a capacitor state or open state depending on a predetermined frequency band in order to convert the carrier and peaking transistors 511 and 512 low impedance into the impedance of the Doherty output combiner stage.

The output combiner stage includes ON/OFF switchable capacitors 519, 521, 522, 523, 525, and combiner lines 520, 524, 526, and 527. The combiner branches are of varying lengths and are selected according to the different LTE RF bands that are selected by the multiple switchable capacitors. In the present exemplary embodiment, a first frequency band has a shortest electrical length, and hence the switchable capacitor 519 is the only capacitor switched to be active so that RF current can travel from the carrier transistor 511 through the combiner line 527 and to the output. The remaining of the switchable capacitors 521, 522, 523, 525 in the output combiner circuit are switched to be in an open position at this time so that no RF current flows through them. The electrical length of the Doherty output combiner for this frequency band is the electrical length of the combiner line 527.

A second frequency band has an intermediate electrical length, and hence the combiner line 520, the switchable capacitor 521, the combiner line 524, and the switchable capacitor 523 are active so that RF current can travel from the carrier transistor 511 through the combiner line 527 and to the output. The remaining of the switchable capacitors 519, 522, and 525 in the output combiner circuit are switched to be in an open position at this time so that no RF current can flow through them. The electrical length of the Doherty output combiner for this frequency band is a sum of electrical lengths of the combiner lines 520, 524, and 527.

A third frequency band has the longest electrical length, and hence the combiner line 520, the switchable capacitor 522, the combiner line 526, and the switchable capacitor 525 are active so that RF current can travel from carrier transistor 511 through the combiner line 527 and to the output. The remaining of the switchable capacitors 519, 521 and 523 in the output combiner circuit are switched to be in an open position at this time so that no RF current can flow through them. The electrical length of the Doherty output combiner for this frequency band is a sum of the electrical lengths of the combiner lines 520, 526 and 527.

A final output transmission line 528, which may be a 35 ohm transmission line to convert the Doherty combiner stage impedance into 50 ohms, has switchable capacitor 529 attached to it. However, the present invention is not limited thereto, and the final output transmission line 528 may be of any suitable resistance value. The switchable capacitor 529 is switched on or off depending on the frequency band in order to improve an output return loss of the Doherty PA 500.

FIG. 6 is a flowchart showing a method of tuning the tunable Doherty PA of FIG. 5 according to an exemplary embodiment of the present invention.

Referring to FIG. 6, a method for tuning a multi-band Power Amplifier (PA), the method includes tuning multi-switchable capacitors of input matching circuits of the multi-band PA in order to select a Radio Frequency (RF) band of a plurality of RF bands in step 601. Next, in step 602, multi-switchable capacitors of amplifiers are tuned in order to amplify a RF signal corresponding to the selected RF band. Next, a plurality of ON/OFF switchable capacitors of an output matching circuit are switched ON or OFF in order to select an output matching circuit corresponding to the amplified RF signal corresponding to the selected RF band in step 603. Then, in step 604, the amplified RF signal is outputted. Furthermore, in order to tune the tunable Doherty PA can be tuned to different RF bands by repeating steps 601 to 604 because the multi-switchable capacitors of the input matching circuits and the multi-switchable capacitors of the amplifiers can be tuned to more than one of the plurality of the RF bands.

Although exemplary embodiments of the present invention have been made using the Doherty PA circuit design, the present invention is not limited thereto. For example, the tunable or switchable capacitors described as being included in the Doherty PA circuit design in order to provide a tunable Doherty PA may be used in other Doherty circuit designs having different architectures, such as an asymmetric Doherty PA, and inverted Doherty PA, an N-way Doherty PA (wherein N is an integer number), and other similar Doherty architectures or other similar power amplifier architectures and circuit designs.

Additionally, aspects of the present invention can be used for any Doherty output combiner irrespective of any changes to the required terminal impedances. Also, aspects of the present invention can be extended to the Doherty amplifier design where different offset line lengths are used at the output of peaking and carrier amplifier by appropriately balancing the phase at the input of the amplifiers. Furthermore, any phase difference that the signal undergoes between a carrier and a peaking amplifier (due to a difference biasing) can be absorbed into a length of the λ/4 output impedance inverter stubs shown in FIG. 5 by making them shorter or longer than λ/4. Alternatively, provision for phase tuning at the input of a carrier/peaking amplifier can be provided by a fixed increase in transmission line length for one amplifier versus the other amplifier. Also, the input and output matching networks may be realized by shunt or series switchable capacitors.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for amplifying Radio Frequency (RF) signals, the apparatus comprising:
a multi-band Power Amplifier (PA) comprising:
a plurality of input matching circuits including switchable capacitors; and
a plurality of output matching circuits including the switchable capacitors,
wherein the multi-band PA is tunable to more than one RF frequency band, and
wherein the output matching circuits comprise a plurality of output combiner branches that are selectively actuated via the switchable capacitors to tune the multi-band PA to each band of the more than one RF frequency band.

2. The apparatus of claim 1, wherein the multi-band PA operates on RF signals having an RF power of at least 50 watts.

3. The apparatus of claim 1, wherein the switchable capacitors are switchable between a plurality of RF bands corresponding to RF bands designated for a transmission of Long Term Evolution (LTE) RF signals.

4. The apparatus of claim 3, wherein one switch setting of the switchable capacitors corresponds to more than one of the designated RF bands.

5. The apparatus of claim 1, wherein the switchable capacitors switch between an ON position corresponding to a capacitor state and an OFF position corresponding to an open circuit state.

6. The apparatus of claim 1, wherein the multi-band PA is a circuit having a Doherty Power Amplifier circuit design.

7. The apparatus of claim 1, wherein the switchable capacitors comprise at least one of a varactor diode, a Barium Strontium Titanate (BST) device, a Micro-Electro-Mechanical Systems (MEMS) device, a Laminated MEMS (LMEMS) device, and a RF switch including a fixed capacitor.

8. The apparatus of claim 1, wherein a number of the output combiner branches corresponds to a number of the more than one RF frequency band.

9. The apparatus of claim 8, wherein each one of the output combiner branches corresponds to a respective one of the number of possible RF frequency bands.

10. The apparatus of claim 8, further comprising:
a hybrid coupler for dividing an input RF signal into a first RF signal and a second RF signal;
a carrier transistor for receiving one of the first or second RF signals and connected between respective ones of the input matching circuits and the output matching circuits; and
a peaking transistor for receiving the other of the first and second RF signals and connected between respective ones of the input matching circuits and the output matching circuits.

11. A method for tuning a multi-band Power Amplifier (PA), the method comprising:
switching switchable capacitors of input matching circuits of the multi-band PA to select a Radio Frequency (RF) band of a plurality of RF bands;
switching switchable capacitors of output matching circuits of the multi-band PA to select a RF band of a plurality of RF bands; and
activating switchable capacitors of amplifiers to amplify a RF signal corresponding to the selected RF band,
wherein the switchable capacitors of the amplifiers can be tuned to more than one of the plurality of the RF bands,
wherein the output matching circuits comprise a plurality of output combiner branches that are selectively actuated via the switchable capacitors to select each one of the plurality of bands that the amplifiers can be tuned to.

12. The method of claim 11, wherein the multi-band PA operates on RF signals having an RF power of at least 50 watts.

13. The method of claim 11, wherein the switchable capacitors are switchable between a plurality of RF bands corresponding to RF bands designated for a transmission of Long Term Evolution (LTE) RF signals.

14. The method of claim 13, wherein one switch setting of the switchable capacitors corresponds to more than one of the designated RF bands.

15. The method of claim 11, wherein the switchable capacitors switch between an ON position corresponding to a capacitor state and an OFF position corresponding to an open circuit state.

16. The method of claim 11, wherein the multi-band PA is a circuit having a Doherty Power Amplifier circuit design.

17. The method of claim 11, wherein the multi-switchable capacitors comprise at least one of a varactor diode, a Barium Strontium Titanate (BST) device, a Micro-Electro-Mechanical Systems (MEMS) device, a Laminated MEMS (LMEMS) device, and a RF switch including a fixed capacitor.

18. The method of claim 11, wherein a number of the output combiner branches corresponds to a number of the more than one RF frequency band.

19. The method of claim 18, wherein each one of the output combiner branches corresponds to a respective one of the more than one RF frequency bands.

* * * * *